United States Patent [19]
Zappe

[11] 3,978,351
[45] Aug. 31, 1976

[54] QUANTUM INTERFERENCE JOSEPHSON LOGIC DEVICES

[75] Inventor: Hans Helmut Zappe, Granite Springs, N.Y.

[73] Assignee: International Business Machines Corporation, Armonk, N.Y.

[22] Filed: June 30, 1975

[21] Appl. No.: 592,000

[52] U.S. Cl............................ 307/306; 357/5; 331/107 S
[51] Int. Cl.².................. H01L 39/22; H03K 3/38
[58] Field of Search................. 357/5; 307/306; 331/107 S

[56] References Cited
UNITED STATES PATENTS

| | | | |
|---|---|---|---|
| 3,886,382 | 5/1975 | Cain | 307/245 |
| 3,891,864 | 6/1975 | Gueret | 307/212 |
| 3,916,391 | 10/1975 | Gueret | 340/173.1 |

OTHER PUBLICATIONS

Jaklevic et al., *Physical Review*, vol. 140, No. 5A, 19 Nov. 65, pp. 1628A–1637A.
Stuehm et al., *Appl. Phys. Lett.*, vol. 20, No. 11, 1 June 72, pp. 456–458.
Jutzi, *I.B.M. Tech. Discl. Bull.*, vol. 17, No. 3, Aug. 1974.
Landman, et al., *I.B.M. Tech. Discl. Bull.*, vol. 17, No. 11, Apr. 1975, p. 3483.

*Primary Examiner*—Martin H. Edlow
*Attorney, Agent, or Firm*—Thomas J. Kilgannon, Jr.

[57] ABSTRACT

A quantum interference Josephson junction logic device is disclosed which comprises three or more junctions connected in parallel which are capable of carrying Josephson current and includes means integral with at least one of the junctions for carrying a larger maximum Josephson current than the remaining junctions. This integral means includes means for carrying a maximum Josephson current which is twice as large as the maximum Josephson current in the remaining junctions. While the spacing between the lobes of the threshold curve ($I_m$ vs. $I_c$) is increased over that of a two junction interferometer by adding another junction resulting in an increased operating region in which logic circuits switch to the voltage state, good current gains with large lobe separation could not be achieved by the mere addition of junctions. Current gain with large lobe separation is obtained if the two outer junctions having a zero field threshold current, $I_o$, are connected via an inductance, L, to the center junction with a maximum Josephson current, $2I_o$. The gain is maximized if the gate current, $I_g$, is fed into the device through inductances, $L_p$, having a value of inductance approximately equal to $3L$ in the center of inductances L which are disposed between pairs of junctions forming a symmetrical dual feed. Increased gain and operating range can be achieved using the symmetrical dual feed and interferometer arrangements where the maximum Josephson current in all the junctions thereof is the same.

41 Claims, 9 Drawing Figures

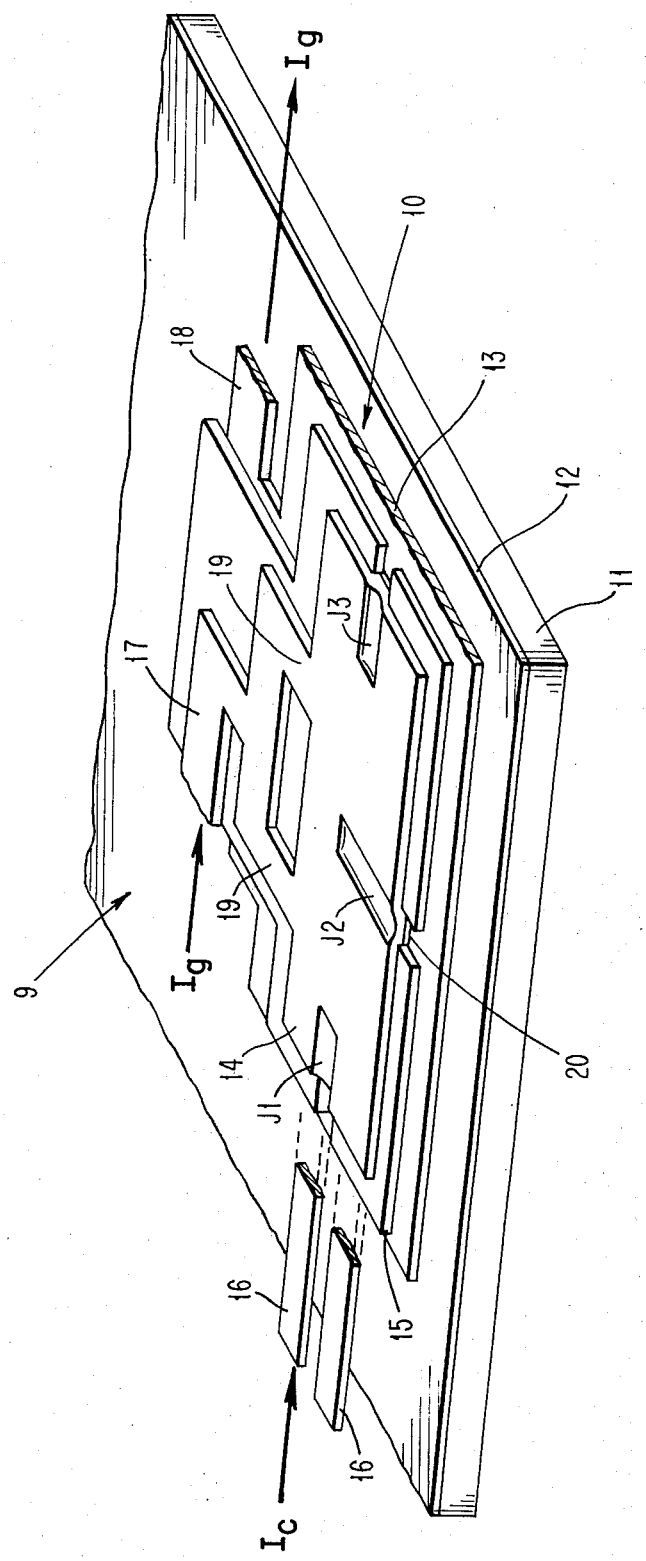

QUANTUM INTERFERENCE JOSEPHSON LOGIC DEVICES

BACKGROUND OF THE INVENTION

1. Field of the Invention

This invention relates generally to Josephson tunneling interferometer devices which have application as logic devices in Josephson tunneling circuits. More specifically it relates to Josephson tunneling interferometer devices which, in contrast to a simple junction, are capable of operating with high current gains at low operating currents and have a threshold characteristic with large lobe separation. This latter feature either maintains or increases the operating margins of the resulting logic devices. Still more specifically, it relates to a Josephson junction interferometer device which contains more than two junctions; preferably three, wherein the maximum Josephson current, $I_m$, is greater and preferably twice as large in the center one of three junctions than the maximum Josephson current in the remaining junctions. In a preferred arrangement, gate current is fed into the interferometer device in a symmetrical manner such that the gate current is applied at the center of an inductance L disposed between the center junction and the outer junctions via inductances which have a value of inductance which can be three times the value of the inductance, L. Because there are such a large number of arrangements which include a plurality of junctions, an equally large number of current feed arrangements are required which can be encompassed by adhering to the following criterion: The current should be fed in so that, with zero control field, the phase difference, $\phi$, across the junctions is the same ($\pi/2$) just prior to switching, that is, all junctions in the interferometer switch simultaneously. While three or more junctions can be utilized to form an interferometer having the desired operating margins and current gains, the small size of the three junction interferometer is most attractive from a practical standpoint. The fact that the interferometer devices of the present application can be operated in both latching and non-latching modes permits them to be utilized in a wide variety of circuit applications.

2. Description of the Prior Art

Josephson junction devices are well known in the prior art for use as both memory devices and as switching devices for use in ultra-high speed logic circuits. The characteristics of a typical Josephson device is described in detail in a publication entitled "The Tunneling Cryotron — A Superconductive Logic Element Based on Electron Tunneling" by J. Matisoo which appeared in the *Proceedings of the IEEE*, February 1967, Vol.55, No.2, pp.172–180. A typical logic device of the character described in the article consists of a gate and a control line which are positioned above but insulated from the gate. The control line is generally made of a superconductor such as niobium, tin or lead. The Josephson junction device itself consists of two strips of superconducting material which overlap. In the region of the overlap, the two strips of superconductive material are separated from each other by a tunnel barrier which may be formed of an oxide of one of the superconductor strips. The oxide barrier usually has a thickness of the order of 10–30 angstroms. The gate and control line are normally placed on a superconducting ground plane and insulated from it. Gate current, $I_g$, is fed through the junction which, being in the zero voltage state, shorts an output impedance, $Z_o$. If the linear sum of the input currents, $I_c$, reduces the Josephson threshold current, $I_m$, below $I_g$, the current switches to a voltage equal to or less than $2\Delta/e$ ($2\Delta/e = 2.5$mV for lead junctions). After switching, the voltage $V_g$ produces a current $I_r$ equal to $V_g/Z_o$ in the output impedance. The resulting current may be utilized to control other circuits. In most instances, the switched junction remains locked in the voltage state and must be reset to the zero voltage state by a momentary decrease in $I_g$. However, d.c. powered non-latching circuits have been proposed by W. Baechtold, *Digest of Technical Papers*, I.S.S.C.C., Philadelphia, 146(1975).

Quantum interference between two parallel Josephson junctions, also called interferometers, has been described by R. C. Jaklevic, J. Lambe, J. E. Mercereau, A. H. Silver, *Physical Review*, 140, A1628, November 1965.

*IBM Technical Disclosure Bulletin*, Vol.17, No.3, August 1974, pp.901–902, in an article entitled "Single Flux Quantum Memory Cell for NDRO" by W. W. Jutzi shows a center fed triple junction interferometer wherein all the junctions are of the same size and carry the same currents. In this arrangement, however, the effort was directed not to increasing the separation between lobes but rather to having a region of overlap where three energy states are possible. The TDB arrangement is really not concerned with devices that switch to the voltage state nor is it concerned with having a large operating range for devices with high gain.

An article entitled "Three Junction Interferometer" by Stuelm and Wilmsen, in *Applied Physics Letters*, Vol.20, No.11, June 1972, pp.458–460, shows an asymmetrically fed triple Josephson junction arrangement in which all the junctions are the same size. This article apparently recognizes that the spacing between the lobes of a Josephson junction threshold curve may be increased by adding an additional junction to the known two junction interferometer. However, while it increases magnetic field sensitivity over the known two junction interferometer, this asymmetrically fed three Josephson junction interferometer does not have the maximum Josephson zero voltage current through it at zero applied magnetic field. The article, however, does indicate that zero applied magnetic field coincides with the maximum current through the interferometer for a symmetrically fed device similar to that shown in the *IBM Technical Disclosure Bulletin*. Thus, while it has been recognized that the magnetic field sensitivity can be improved in both the two and three junction interferometers, all of these arrangements are concerned with enhancing the aforementioned magnetic field sensitivity and not with achieving high current gains while simultaneously improving the operating margins of devices which are to be used in the logic environment.

SUMMARY OF THE INVENTION

In accordance with the broadest aspect of the present invention a multiple junction interferometer circuit is provided which comprises at least three junctions capable of carrying Josephson current connected in parallel at least one of which carries at least the same maximum Josephson current as the others and means connected to the junctions for feeding current thereto so that, with zero control field, the phase difference across the junctions is the same prior to switching.

In accordance with the broader aspects of the present invention, a multiple junction interferometer circuit is provided which comprises at least three junctions capable of carrying Josephson current connected in parallel and means integral with at least one of the junctions for carrying a larger maximum Josephson current than the remaining junctions.

In accordance with the broader aspects of the invention, a multiple junction interferometer is provided wherein the means for carrying a larger maximum Josephson current includes means for carrying a maximum Josephson current which is twice as large as the maximum Josephson current in the remaining junctions.

In accordance with the broader aspects of the invention, the multiple junction interferometer is provided which further includes means connected to the interferometer for applying current to the junctions.

In accordance with the broader aspects of the present invention, a multiple junction interferometer circuit is provided which comprises at least three junctions capable of carrying Josephson current connected in parallel at least one of which carries at least the same amount of maximum Josephson current as the other and dual current feed means connected to said at least three junctions.

In accordance with broader aspects of the present invention, a multiple junction interferometer is provided which further includes at least a single control element disposed in insulating spaced relationship with at least one of the inductive loops comprising the device and further includes output means connected in parallel with the interferometer.

In accordance with still broader aspects of the present invention, the means integral with at least one of the junctions for carrying a larger maximum Josephson current includes a junction of larger size; a tunnel barrier having a thickness different from the tunnel barrier thickness of the remaining junctions; at least one electrode of one of the junctions of conductive material having a work function different from the work function of at least one electrode of the remaining junctions.

In accordance with a more particular aspect of the present invention, the means connected to the interferometer for applying current to said junctions includes at least two inductances connected to the center point of inductive elements disposed between a centrally disposed junction and a pair of outer junctions, said inductances each having a value three times the inductance of the inductances disposed between the centrally disposed junction and a pair of outer junctions.

It is, therefore, an object of this invention to provide a multiple junction interferometer circuit which has high current gain and considerably increased operating margins.

Another object is to provide a multiple junction interferometer wherein the device consists of three junctions the center one of which is designed to carry a maximum Josephson current which is twice the current in each of the other junctions.

Still another object is to provide a multiple junction interferometer circuit wherein the current feed configuration to the interferometer provides a circuit with improved gain and operating margins over those of prior art circuits.

Still another object is to provide a multiple junction logic circuit which is capable of being operated in both a latching and non-latching mode.

Still another object is to provide a multiple junction interferometer for use in logic circuits which has very low power dissipation and very high speed switching.

The foregoing and other objects, features and advantages of the invention will become apparent from the following more particular description of the preferred embodiment of the invention as illustrated in the accompanying drawings.

BRIEF DESCRIPTION OF THE DRAWINGS

FIG. 5 shows a perspective representation of the symmetrical, dual feed interferometer the threshold characteristic of which and the schematic equivalent circuit of which are shown in FIGS. 3A, 3B, respectively. The arrangement shown may be utilized for both latching and non-latching logic operations.

DESCRIPTION OF PREFERRED EMBODIMENTS

As has been indicated hereinabove, in the discussion of the prior art, both asymmetric and center-fed triple junction interferometers wherein all the junctions are of the same size and carry the same current are well known. To more fully develop the present contribution, a comparison between the prior art arrangements and the circuits of the present invention is believed to be in order. Accordingly, in the discussion which follows, a center-fed interferometer with junctions of the same size, a center-fed interferometer wherein the center junction of three is twice the size of the remaining junctions, and a symmetric dual-feed three junction interferometer wherein the center junction of three carries twice the maximum Josephson current will be discussed. In addition, three and four junction interferometer circuits having symmetrical dual current feed means and the same maximum Josephson current through all the junctions will be discussed.

Figure 1A:
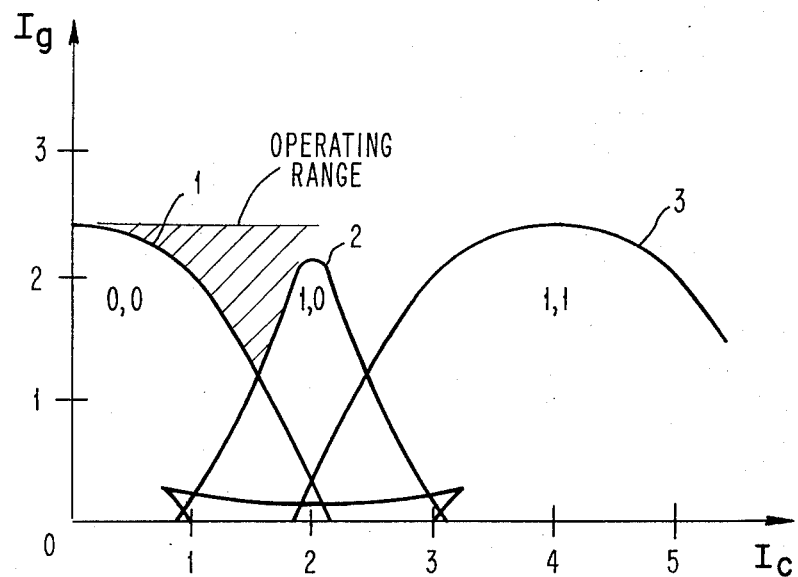
FIG. 1A shows the threshold characteristic, $I_g$ vs. $I_c$, for a center fed prior art interferometer comprising three junctions all of which are the same size and carry the same maximum Josephson current, $I_o$. The figure shows only the threshold characteristic for positive values of $I_g$ and $I_c$.

Referring now to FIG. 1A, there is shown the threshold characteristic, $I_g$ vs. $I_c$, for a center-fed prior art interferometer comprising three junctions all of which are the same size and carry the same maximum Josephson current, $I_o$. While it should be appreciated that a similar characteristic exists for negative values of $I_g$ and $I_c$, only the threshold characteristic for positive values of $I_g$ and $I_c$ have been shown for purposes of clarity and simplification. The threshold characteristic of FIG. 1A should be considered with FIG. 1B which shows a schematic of a center-fed interferometer, all the junctions of which carry the same maximum Josephson current.

Figure 1B:
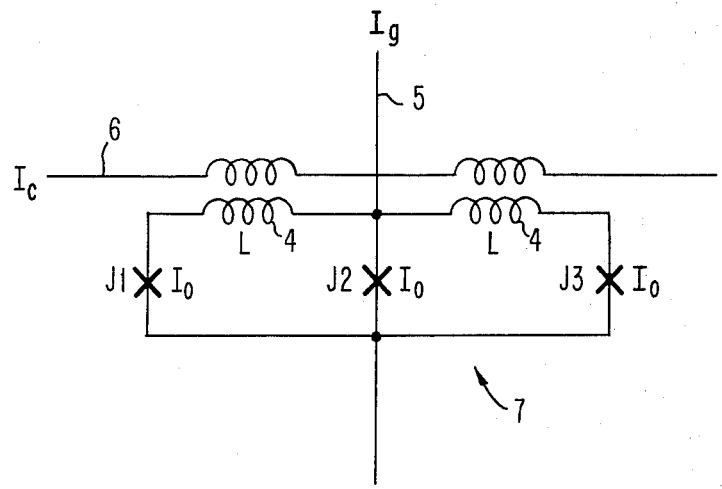
FIG. 1B shows a schematic of a center fed interferometer, all the junctions of which carry the same maximum Josephson current, the threshold characteristic of which is shown in FIG. 1A.

The threshold characteristic of FIG. 1A is obtained by applying gate current, $I_g$, to the device of FIG. 1B and determining the points at which the device of FIG. 1B switches to the voltage state as the gate current, $I_g$, is varied while the control current, $I_c$, is held constant, or vice versa. Thus, in FIG. 1A threshold curve 1 shows the switching threshold for the 0,0 vortex mode while curves 2 and 3 show the switching threshold for the 1,0 and 1,1 vortex modes, respectively. Thus, any time the applied gate current exceeds the switching thresholds indicated by the envelope of curves 1,2,3, the device of FIG. 1B switches from the zero voltage state to the voltage state. In those regions where curves 1,2,3 overlap, the boundaries of these curves in the overlapping regions are determined by detecting the change in state between vortex modes. These changes in state are detected by measuring the current pulse which is due to the trapping or expulsion of flux quanta from the device of FIG. 1B.

In FIG. 1B, junctions J1, J2 and J3 are all of the same size and, as a consequence, all other things being equal, carry the same maximum Josephson current, $I_o$. These junctions in conjunction with inductances 4 and centrally disposed gate current feed line 5 and control line 6 form interferometer device 7 which has the threshold characteristics shown in FIG. 1A.

Using device 7 and its associated threshold characteristic shown in FIG. 1A as a criterion, it can be seen that a cross-hatched area otherwise indicated as "OPERATING RANGE" is obtained. Using for gain the ratio of $I_g$ to $I_c$ as a very rough approximation for gain, it can be seen from FIG. 1A that only with tightly controlled margins and extremely good regulation of current can decent gains be obtained.

At this point, it should be appreciated that the arrangement of FIG. 1B represented an improvement over two junction interferometers to the extent that the addition of the third junction moved the lobes apart. However, while moving the lobes apart, the gain was not substantially increased nor was the operating range enhanced to the extent that very tight control of $I_g$ and $I_c$ could be relaxed. Also, it should be clear from FIG. 1B that, though the currents through junctions J1, J2, J3 are normally equal to $I_o \sin \phi$, the current through junction J2 is different from the currents through J1 and J3 because the current through J2 encounters a lower impedance path. As a result, the phase difference, $\phi$, across the junction is not the same at zero field prior to switching.

To overcome the gain and margin problems associated with device 7 of FIG. 1B, the maximum Josephson current $I_o$ of device 7 was increased by permitting a current, $2I_o$, to be carried by the center leg of device 7 of FIG. 1B. The resulting interferometer device 8 is schematically shown in FIG. 2B with junction J2 being schematically indicated by a larger X than junctions J1 and J3. Device 8 is center fed by gate current feed line 5 and controlled by control line 6. Inductances 4 have the same value and are disposed in a similar manner to that shown in FIG. 1B.

Figure 2A:
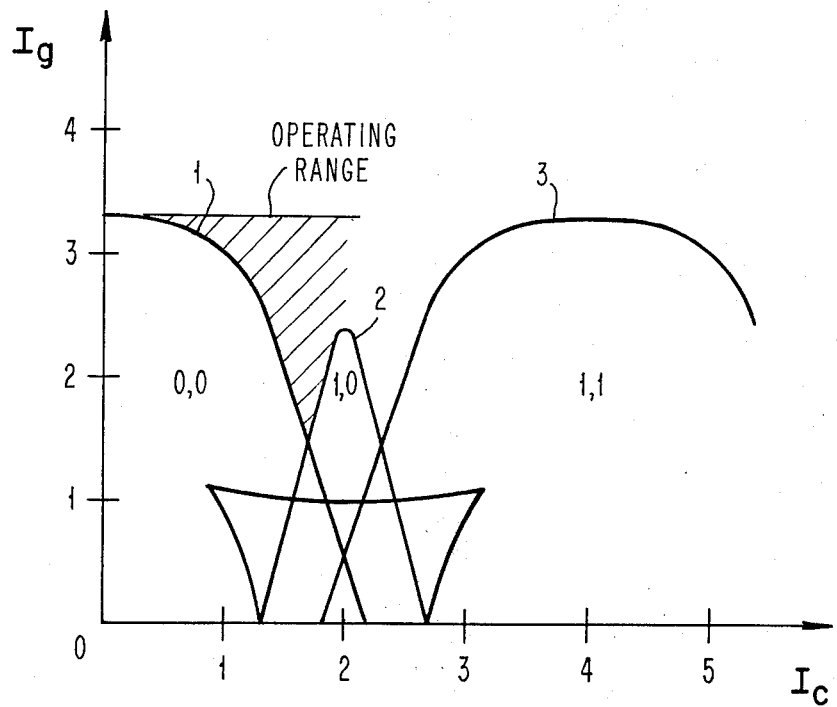
FIG. 2A shows the threshold characteristic, $I_g$ vs. $I_c$, for a center fed interferometer comprising three junctions the center one of which carries twice as much current, $2I_o$, as the remaining junctions. The threshold characterisitc is shown only for positive values of $I_g$ and $I_c$.
Figure 2B:
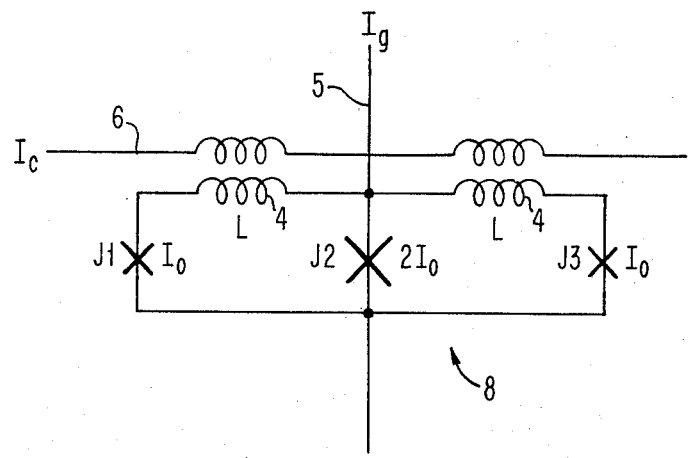
FIG. 2B shows a schematic of a center fed interferometer, one junction of which carries twice the maximum Josephson current of the remaining junctions; the threshold characteristic of which is shown in FIG. 2A.

FIG. 2A, which is obtained in a manner similar to that described in connection with FIG. 1A, shows the threshold characteristics of device 8 of FIG. 2B. As can be observed from a consideration of FIG. 2A, the amplitude of the main and side lobes 1,2,3 of the threshold characteristic has been increased over the amplitude of those shown in FIG. 1A. This indicates that the gain of device 8 has been increased over the gain of device 7. It should also be noted, however, that the amplitude of curve 2 in FIG. 2A has also been increased, again subjecting devices similar to device 8 to margin problems which relate to the preciseness with which gate current and control current must be applied and to the ability to closely regulate the current applied. At this point, it should be appreciated that the problem being overcome by the teaching of the present application deals with practical problems which, considering the present state of the art, cannot be overcome by simply applying very large gate currents and very small control currents with all the attendant implications of very high theoretical gain. All the theoretical possibilities notwithstanding, it is simply not enough to be able to pinpoint values of gate current and control current which will provide one with large gain. The practical limitations on all the parameters involved in providing a circuit or device which operates in the real world require that the device or circuit be still operable when a number of parameters change from their nominal values. Accordingly, such devices or circuits should have the ability to operate over a relatively wide range of parameter variation without sacrificing, for example, gain. In this respect, the circuit of FIG. 2B, while providing good gain characteristics, and improved "OPERATING RANGE" as indicated by the cross-hatched area in FIG. 2B, still requires relatively tight control over the parameters $I_g$ and $I_c$ because the amplitude of side lobe 2 has also increased slightly from the amplitude of side lobe 2 shown in FIG. 1A. Thus, while the gain and operating range have increased, the operating range of the circuit of FIG. 2B still leaves something to be desired. While the current through junction J2 has bee indicated as being twice the current through junctions J1, J3, it should be appreciated that as soon as the maximum Josephson current through junction J2 was increased from $I_0$, an improvement in gain and operating margins was noted. It should be noted in FIG. 2B that the same condition with respect to the phase difference, $\phi$, discussed hereinabove in connection with FIG. 1B also pertains to the arrangement of FIG. 2B.

Figure 3A:
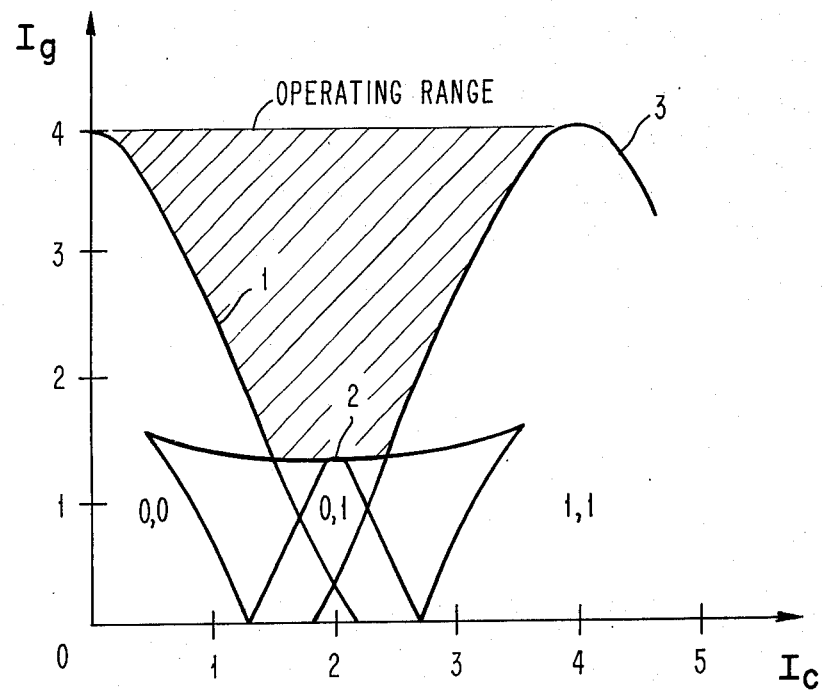
FIG. 3A shows the threshold characteristic, $I_g$ vs. $I_c$, for a symmetrically disposed, dual feed three junction interferometer wherein the center junction carries twice the maximum Josephson current of the other junctions. The threshold characteristic is shown only for positive values of $I_g$ and $I_c$.
Figure 3B:
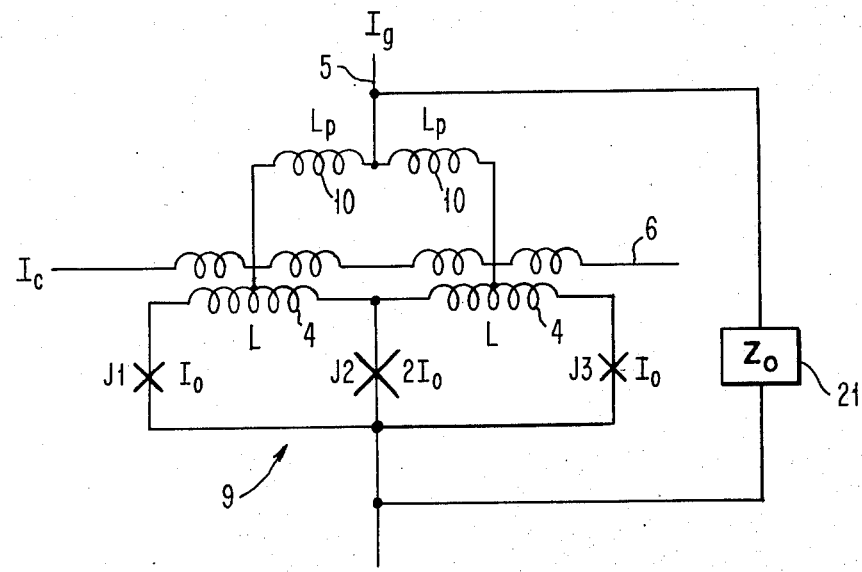
FIG. 3B shows a schematic of a symmetrical, dual feed interferometer, one junction of which carries twice the maximum Josephson current of the other junctions; the threshold characteristic of which is shown in FIG. 3A.
Figure 4:
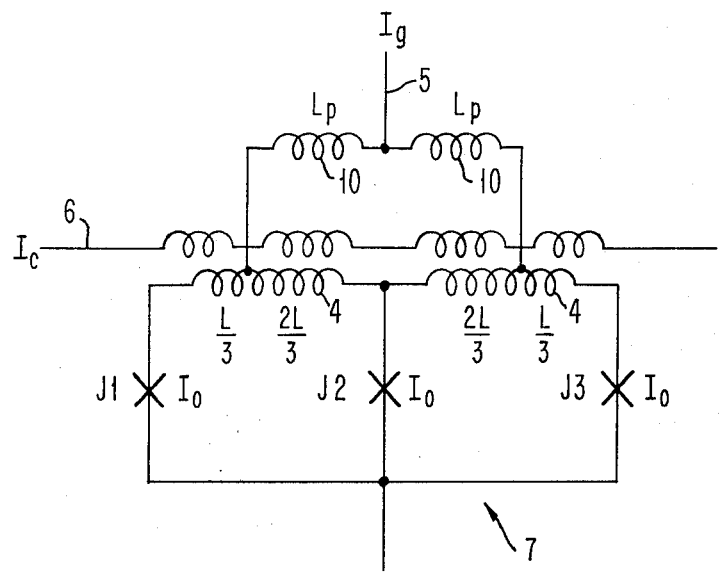
FIG. 4 shows a schematic of an interferometer circuit similar to that shown in FIG. 1B except that the symmetrical dual current feed of FIG. 3B is utilized and connected in such a way as to insure the same phase difference, $\phi$, across all the junctions.

Referring now to FIGS. 3A and 3B, there is shown therein the threshold characteristic for a three junction interferometer the center one of which carries twice the maximum Josephson current of the others and is provided with a symmetric dual feed for the application of gate current. FIG. 3B shows a schematic diagram of interferometer device 9 which is similar in all respects to the arrangement of FIG. 2B except that the gate current is fed via inductances 10, otherwise identified in FIG. 3B as $L_p$, to the center point of inductances 4, otherwise identified in FIG. 3B as L, to junctions J1, J2 and J3. As in FIG. 2B, the center junction J2 is, for example, twice the size of junctions J1, J3. Control line 6 is inductively coupled to inductances 4 and to the loops formed, on one hand, by an inductance 4, junctions J1,J2 and the interconnection therebetween and, on the other hand, by an inductance 4, junctions J2,J3 and the interconnection therebetween. A consideration of the threshold characteristic of FIG. 3A shows the device 9 of FIG. 3B has undergone a considerable improvement both in gain and operating range as a result of providing the symmetrical dual feed and a junction capable of carrying twice the maximum Josephson current as the other junctions of device 9. FIG. 3A clearly shows that the amplitude of main lobe 1 has peaked up to a larger amplitude value than the main lobe 1 of FIGS. 2A and 2B. In addition, main lobe 1 is considerably narrower near the top providing, using the rough approximation of the ratio of gate current to control current, gains in excess of 3. In addition, because the amplitude of side lobe 2 has now been considerably diminished, the extremely tight tolerances on gate and control currents for the device of FIG. 1B and the somewhat less restrictive tolerances on the currents applied to the device of FIG. 2B are no longer necessary because of the availability of a relatively wide operating range available between main lobe 1 and side lobe 3 of FIG. 3B. The cross-hatched area identified as "OPERATING RANGE" in FIG. 3B shows the improvement at a glance. In FIG. 3B which shows the preferred embodiment of the present invention, inductances 10 have a value of inductance equal to three times the value of inductance 4. The inductance of inductance 10 may vary preferably over a range of from two to five times the inductance of inductance 4. All of these values of inductance in the range mentioned provide improved gain and operating range over the arrangement shown in FIG. 1B. Also, while the inductances 10 in FIG. 3B have been shown as being connected to the midpoints of inductances 4, it should be appreciated that connections to inductances 4 can be connected at points other than the midpoint of inductances 4. The major criterion to be adhered to in providing multiple junction interferometers with high gain and wide operating range is that current should be fed in so that the phase difference, $\phi$, across the junctions at zero applied field is always the same just prior to switching. This criterion applies regardless of the number of junctions over two being utilized. Accordingly, even prior art arrangements similar to that shown in FIG. 1B can have higher gain and an improved operating range by making sure that the phase difference, $\phi$, is the same across all the junctions. This can be accomplished as shown in the schematic of FIG. 4 by adjusting the symmetrical dual current feed so that inductances 10 are connected to inductances 4 in such a way as to divide them in the L/3, 2L/3 ratio shown. Thus, depending on the number of junctions being utilized, the symmetrical dual current feed of the present invention can be utilized in multiple junction interferometers both where the maximum Josephson current through one of the junctions is larger than through the others and where the maximum Josephson current through all the junctions is the same. It should be clear from what has gone before that any number of junctions may be utilized and that if the phase difference is properly controlled by adjusting the values of inductance encountered by the gate current, interferometer circuits of high gain and improved operating margins can be achieved.

Referring now to FIG. 5 there is shown therein a perspective representation of the symmetrical, dual feed interferometer device 9, the threshold characterisitc of which and the schematic equivalent circuit of which are shown in FIGS. 3A,3B, respectively. Interferometer device 9 comprises a ground plane 11 of superconducting material such as niobium. A thin layer 12 of oxide such as niobium oxide ($Nb_2O_5$) separates ground plane 11 from the next layer, portions of which form the base electrodes of junctions J1, J2 and J3. The inductances L are formed by lead alloy superconductors which form base electrode 13 and counterelectrode 14. The inductances result from spacing layers 13 and 14 with a layer 15 of an oxide such as silicon oxide which is much thicker than the oxide between those portions of counterelectrode layer 14, which dip toward base electrode 13 via holes in oxide layer 15, and base electrode 13 to form junctions J1,J2,J3. Two insulated control lines 16 are disposed in overlying relationship with counterelectrode 14 and are spaced therefrom by an insulating layer (not shown). Control current, $I_c$, is applied via control lines 16 while gate current, $I_g$, is applied to an extension 17 of counterelectrode 14 and exits from the device via an extension 18 of base electrode 13 as shown in FIG. 5. The arrangement of FIG. 5 provides for the feeding of gate current, $I_g$, via two branches 19 which are spaced from base electrode 13 by oxide 15 and provide inductances, $L_p$, which are equal in value to 3L. Branches 19 form the symmetrical dual feeds which are connected to counterelectrode 14 which, when it is spaced from base electrode 13 by oxide layer 15, forms inductances of value L. Branches 19 are so constructed that they effectively feed the midpoints of inductances L which have been otherwise referred to as inductances 4 in FIG. 3B. Inductances $L_p$ have been otherwise referred to as inductances 10 in FIG. 3B. Control lines 16, of course, are coupled electromagnetically to the loops formed by devices J1,J2,J3, inductances L, the base and counter electrodes and their associated metallization. Because control lines 16 are coupled to the loops as indicated, various logic functions such as AND, OR etc., can be carried out. For example, for the AND function both control lines 16 must be energized before circuit arrangement 9 switches. For an OR operation, where one or the other of control lines 16 is energized, arrangement 9 switches. Any number of control lines 16 may be utilized limited only by the ability to properly position them.

While no mention has been made until this point of the characteristics of junctions J1, J2 and J3, it should be noted that these junctions are formed in the usual manner by forming a thin oxide of between 10 and 30 angstroms to form a tunnel barrier between base and counter electrodes which, as has been indicated, are of superconducting material. Thus, junction J2, for example, in the perspective view of FIG. 5 has a thin oxide layer 20 whch forms the tunnel barrier between base electrode 13 and counterelectrode 14. In order to fulfill the requirement of carrying twice the maximum Josephson current as junctions J1,J3, junction J2 is twice as long as junctions J1,J3. Because of the need to form inductances 4 and 10, the simplest approach to causing junction J2 to carry twice the maximum Josephson current was to make the area of junction J2 twice as large as junctions J1,J3. It should be appreciated, however, that any other technique for increasing the maximum Josephson current in one of the junctions such as providing a different work function for one of the electrodes may be utilized. In another instance, the thickness of the tunneling oxide may be adjusted to control the maximum Josephson current. It should also be appreciated that, in addition to the well-known Josephson structures which incorporate tunneling oxides, well-known weak link arrangements may be substituted for the Josephson devices which incorporate tunnel barriers without departing from the spirit of the present invention. In the weak link environment, the maximum Josephson current value may be controlled by adjusting the cross-section of the constriction, the shape of the constriction or the length and width of the constriction.

In addition to the usual Josephson junction device which incorporates a tunnel barrier and weak links, it should be appreciated that a normal metal may be substituted for the tunnel barrier or a vacuum may be utilized where one can be appropriately incorporated. The former of the devices indicated are well known in the prior art as S-N-S (Superconducting Metal-Normal Metal-Superconducting Metal) devices. In these devices as in all the arrangements suggested, any approach for controlling the maximum Josephson current may be utilized to provide a different maximum Josephson current in at least one of the junctions which make up the interferometer devices of the present invention.

Returning now to FIG. 5, interferometer device 9 may be fabricated in accordance with fabrication techniques well known to those skilled in the semiconductor and Josephson technologies. Thus, the metallic layers are formed by well-known vacuum deposition techniques; junction oxides are formed and their thickness controlled by a sputtering technique taught in U.S. Pat. No. 3,849,276 in the name of J. Greiner to the same assignee as the assignee of the present invention; other oxides are formed by well-known evaporation techniques and the latter along with the various metal layers are delineated using well-known photolithographic masking and etching techniques. Since the fabrication technique forms no part of the present invention, it is believed that the foregoing description, which invokes well-known prior art techniques and patents, is sufficient for one skilled in the art to fabricate devices of the character described hereinabove.

Device 9 of FIG. 5, when fabricated, can have the following representative parameters. Using a ground plane 11 of niobium, base electrode 13 is spaced therefrom by 500 A thick layer 12 of niobium oxide. The inductances L which are formed by layers 13,14 of lead alloy superconductors are separated from each other by 4000 A thick layer 15 of silicon oxide. Under such circumstances, the inductances L have values of approximately 1.3 picohenrys. The main portion of counterelectrode 14, which does not include extension 17 or branches 19, has a size of $51 \times 269$ $\mu m^2$, and forms junctions with base electrode 13 through slots in SiO layer 15. Junctions J1 and J3 have an area of approximately $9 \times 11.5$ $\mu m^2$, the center junction J2 being twice as long. Two insulated 13 $\mu m$ wide control lines 16 are disposed in overlying relationship with counterelectrode 14. The inductances $L_p$ formed by branches 19 and oxide spaced base electrode 13 have values of approximately 3.9 picohenrys.

Interferometer 9 has an I-V characteristic similar to that of other Josephson devices. It has a zero field threshold current ($I_{mo} = 4I_o = 0.7mA$). Device 9 operates at low current levels in essentially the same way as well-known Josephson devices. The dissipation is approximately 1.5 microwatts in continuous operation with an appropriate load. Where device 9 operates in a latching mode, a pulsed power source is required to ensure resetting after each logic cycle. Thus, by applying a control current which generates a magnetic field which, in turn, is magnetically coupled to device 9, the maximum value of Josephson threshold current at which device 9 switches is reduced and devices J1–J3 switch to the voltage state delivering essentially all of the gate current into a properly chosen load which is connected in parallel with device 9. The connection of load 21 shown schematically in FIG. 3B is made in the usual manner via interconnecting transmission lines and may have an impedance, $Z_o$, which is equal to the characteristic impedance of the interconnecting transmission lines. Load 21, in an alternative modes of connection to device 9 may be connected in parallel with any of the devices J1,J2,J3.

Device 9 is not limited to operating in the latching mode just described. It may also be operated in a non-latching mode. The minimum current at which a Josephson junction switches from the voltage state back to its zero voltage state can be increased by connecting a small resistive load in parallel with the device. It is well known that the hysteresis of the voltage state of Josephson junctions becomes negligible if $\beta = 2\pi CR^2 I_m/\phi_o \gtrsim 2$, where $C$ is the junction capacitance, $I_m$ is the maximum Josephson threshold current, $R$ is the value of a resistive load, $\phi_o$ is a flux quantum and $\beta$ is a damping constant. With a load of appropriate resistance, the Josephson oscillations of device 9 have a voltage amplitude which is of the same order as the mean d.c. junction voltage. The amplitude of these oscillations increases as the control current decreases and self resetting can occur when the junction voltage is momentarily zero during the negative swing of such an oscillation. In the usual Josephson junction, the capacitance of such junctions is generally so large that non-latching operation requires unreasonably low output line impedances. In interferometers, however, both C and $I_m$ can be made small. Thus, using interferometers of the character of device 9, self resetting operation occurs at high impedances. Non-latching operation of interferometer device 9 may be achieved with an external load resistance $\geqslant 0.15$ $\Omega$. In the usual circuit application, the terminated transmission lines may control a succeeding device.

Figure 6:
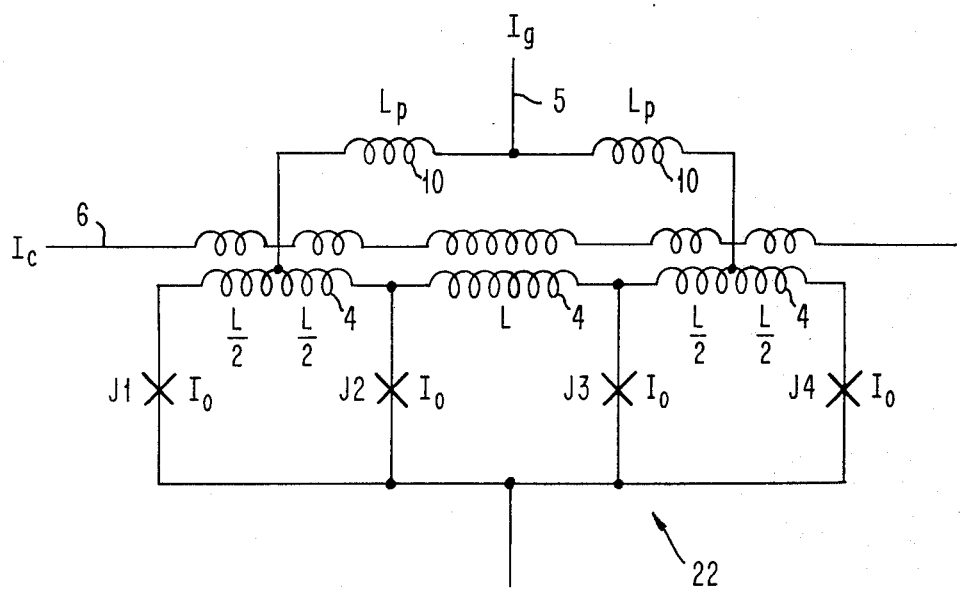
FIG. 6 shows a schematic of another embodiment of a multile junction interferometer in accordance with the teaching of the present invention which incorporates four junctions and is symmetrically fed so that, with zero control field, the phase difference, $\phi$, is always the same in each of the junctions prior to switching. The symmetrical dual current feed provides for enhanced gain and operating margins even though all the junctions carry the same maximum Josephson current.

Referring now to FIG. 6 there is shown therein a multiple junction interferometer 22 having four junctions and including a symmetrical dual current feed arrangement which insures that the phase difference is always the same across each junction prior to switching at zero applied field. FIG. 6 is similar to FIG. 3B except that it incorporates an additional junction J4 and current through all the junctions is the same. Under the conditions shown in FIG. 6, the incoming current encounters symmetrical feed impedances and because the currents through devices J1–J4 are the same, the phase difference across all the junctions is the same and the relationship of current and inductance is linear. If, however, one or the other of these values is changed, for example, if the current through junction J3 is increased, the values of inductance will have to be changed to insure that the phase difference across all the junctions is the same. These values can be mathematically determined and such capability is within the skill of a person skilled in the Josephson art.

From all the foregoing, it should not be implied that the limit of the maximum Josephson current in any device is two. The maximum Josephson current may have any value limited only by practical consideration such as three, four, five, etc. In any give circuit arrangement, the maximum Josephson current need only be larger by a fractional amount in one junction to achieve some improvement. Also, it should be appreciated that the maximum Josephson current can be larger in more than one junction and improvement in gain and operating range achieved as long as the phase difference across all junctions is the same. Independent adjustment of inductance or adjustment of current through the junctions, as indicated hereinabove, may be utilized to achieve this end. Finally, it should be appreciated that the circuits disclosed herein are susceptible of scaling. As long as the relative values of current through the junctions remain the same, the same circuit arrangement can be utilized without departing from the teaching of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A multiple junction interferometer circuit comprising at least three junctions capable of carrying Josephson current connected in parallel, and,
   means connected to said junctions for setting the phase difference, $\phi$, across said junctions to substantially the same value with zero control field prior to switching.

2. A multiple junction interferometer circuit according to claim 1 further including at least a single control element disposed in insulating spaced relationship with at least one of said at least three junctions.

3. A multiple junction interferometer circuit according to claim 1 further including output means connected in parallel with said interferometer circuit.

4. A multiple junction interferometer circuit according to claim 1 wherein said means for setting the phase difference includes means connected to said interferometer circuit for applying current to said junctions.

5. A multiple junction interferometer circuit according to claim 1 wherein said at least three junctions carry the same maximum Josephson current.

6. A multiple junction interferometer circuit according to claim 1 wherein at least one of said at least three junctions carries a larger maximum Josephson current than the remaining junctions.

7. A multiple junction interferometer circuit according to claim 1 wherein at least one of said at least three junctions carries a maximum Josephson current which is twice as great as the maxium Josephson current in the remaining junctions.

8. A multiple junction interferometer circuit according to claim 3 wherein said output means includes a pair of transmission lines and an impedance equal to twice the characteristic impedance of said transmission lines.

9. A multiple junction interferometer according to claim 3 wherein said output means includes an impedance having a value sufficient to operate said interferometer circuit in a non-latching mode.

10. A multiple junction interferometer according to claim 3 wherein said output means includes an impedance having a value sufficient to operate said interferometer circuit in a latching mode.

11. A multiple junction interferometer circuit according to claim 4 wherein said means for applying current to said junctions includes a source of gate current and dual gate current feed lines one of which is connected between two of said at least three junctions and the other of which is connected between two of said at least three junctions.

12. A multiple junction interferometer circuit according to claim 4 wherein said means for applying current to said junctions includes a source of gate current and dual gate current feed lines one of which is connected between a centrally disposed junction and one of said at least three junctions and the other of which is connected between said centrally disposed junction and another of said at least three junctions.

13. A multiple junction interferometer circuit according to claim 4 further including means integral with at least one of said junctions for carrying a larger maximum Josephson current than the remaining junctions.

14. A multiple junction interferometer circuit according to claim 4 further including means integral with at least one of said junctions for carrying a maximum Josephson current which is twice as great as the maxium Josephson current in the remaining junctions.

15. A multiple junction interferometer circuit according to claim 4 wherein said means for applying current includes a source of current and dual branch gate current feed lines each of said branches having an inductance of value $L_p$ and each branch being connected to an inductive element the latter being disposed between an internally disposed junction of said at least three junctions and one of a pair of outer junctions and betweeen an internally disposed junction and the other of said pair of outer junctions, each said inductive elements having an inductance of value L and where $L_p$ has a value of inductance greater than the value of L.

16. A multiple junction interferometer circuit according to claim 5 wherein said means for setting the phase difference includes a source of gate current and dual gate current feed lines one of which is connected between two of said at least three junctions and the other of which is connected between two of said at least three junctions.

17. A multiple junction interferometer circuit according to claim 5 wherein said means for setting the phase difference includes a source of gate current and dual gate current feed lines one of which is connected between a centrally disposed junction and one of said at least three junctions and the other of which is connected between said centrally disposed junction and another of said at least three junctions.

18. A multiple junction interferometer circuit according to claim 6 wherein sid means for setting the phase difference includes a source of gate current and dual gate current feed lines one of which is connected between one of said remaining junctions and said at least one of said junctions and the other of which is connected between the other of said remaining junctions and said at least one of said junctions.

19. A multiple junction interferometer circuit according to claim 7 wherein said means for setting the phase difference includes a source of gate current and dual gate current feed line one of which is connected between one of said remaining junctions and said at least one of said junctions and the other of which is connected between the other of said remaining junctions and said at least one of said junctions.

20. A multiple junction interferometer circuit according to claim 11 further including at least a single control element disposed in insulating spaced relationship with at least one of said at least three junctions and output means connected in parallel with said circuit.

21. A multiple junction interferometer circuit according to claim 12 further including at least a single control element disposed in insulating spaced relationship with at least one of said at least three junctions and output means connected in parallel with said circuit.

22. A multiple junction interferometer circuit according to claim 13 wherein said means integral with at least one of said junction for carrying a larger maximum Josephson current includes a junction of larger size.

23. A multiple junction interferometer circuit according to claim 13 wherein said means for carrying a larger maximum Josephson current includes a tunnel barrier having a thickness different from the tunnel barrier thickness of the remaining junctions.

24. A multiple junction interferometer circuit according to claim 13 wherein said means for carrying a larger maximum Josephson current includes at least one electrode of said at least one of said junctions of conductive material having a work function different from the work function of at least one electrode of said remaining junctions.

25. A multiple junction interferometer circuit according to claim 13 wherein said junctions are weak links.

26. A multiple junction interferometer circuit according to claim 14 wherein said means for carrying a maximum Josephson current which is twice as large includes a junction which is two times larger than said remaining junctions.

27. A multiple junction interferometer circuit according to claim 14 wherein said means for carrying a maximum Josephson current which is twice as large includes a tunnel barrier having a thickness different from the tunnel barrier thickness of said remaining junctions.

28. A multiple junction interferometer circuit according to claim 14 wherein said means for carrying a maximum Josephson current which is twice as large includes at least one electrode of said at least one of said junctions of conductive material having a work function different from the work function of at least one electrode of said remaining junctions.

29. A multiple junction interferometer circuit according to claim 14 wherein said junctions are weak links.

30. A multiple junction interferometer circuit according to claim 13 wherein said means for applying current includes a source of current and dual branch gate current feed lines each of said branches having an inductance of value $L_p$ and each branch being connected to an inductive element the latter being disposed between said at least one of said junctions and one of said remaining junctions and between said at least one of said junctions and the other of said remaining junctions, each of said inductive elements having an inductance of value L and wherein $L_p$ has an value of inductance in a range of two to five times the value of L.

31. A multiple junction interferometer circuit according to claim 14 wherein said means for applying current includes a source of current and dual branch gate current feed lines each of said branches having an inductance of value $L_p$ and each branch being connected to the midpoint of an inductive element, the latter being diposed between said at least one of said junctions and one of said remaining junctions and between said at least one of said junctions and the other of said remaining junctions each of said inductive elements having an inductance of value L and wherein $L_p$ has a value of inductance three times the value of L.

32. A multiple junction interferometer circuit according to claim 15 wherein said interferometer circuit includes four junctions having the same maximum Josephson current therethrough and three inductive elements one of the latter being disposed between internally disposed junctions and the others of the latter being disposed between an internally disposed junction and each of said pair of outer junctions, each of said branches being respectively connected to the midpoint of said inductive elements which are disposed between an internally disposed junction and said pair of outer junctions.

33. A multiple junction interferometer circuit according to claim 15 wherein said interferometer circuit includes three junctions having the same maximum current therethrough and two inductive elements the latter being disposed between an internally disposed junction and each of said pair of outer junctions each of said branches being connected to a point on each of said inductive elements such that inductive elements are divided in a ratio of 2L/3, L/3 that portion of each of said inductive elements represented by the former being disposed adjacent said internally disposed junction.

34. A multiple junction interferometer circuit comprising at least three junctions capable of carrying Josephson current connected in parallel forming a plurality of superconducting loops,
means integral with at least one of said junctions for carrying a larger maximum Josephson current than the remaining junctions, and,
at least a single control element electromagnetically coupled to at least one of said loops.

35. A multiple junction interferometer circuit according to claim 34 further including dual gate current feed means connected to said at least three junctions.

36. A multiple junction interferometer circuit according to claim 35 further including output means connected in parallel with said junctions.

37. A multiple junction interferometer circuit according to claim 35 wherein said dual gate current means includes two branches each of which has an inductance of value $L_p$ and being connected to an inductive element the latter being disposed between said at least one of said junctions and one of said remaining junctions and between said at least one of said junctions and the other of said remaining junctions each of said inductive elements having an inductance of value L and wherein $L_p$ has a value of inductance in a range of two to five times the value of L.

38. A multiple junction interferometer circuit according to claim 36 wherein said output means includes a pair of transmission lines and an impedance equal to twice the characterisitic impedance of said transmission lines.

39. A multiple junction interferometer according to claim 36 wherein said output means is an impedance having a value sufficient to operate said interferometer circuit in a non-latching mode.

40. A multiple junction interferometer according to claim 36 wherein said output means is an impedance having a value sufficient to operate said interferometer circuit in a latching mode.

41. A multiple junction interferometer circuit according to claim 37 wherein said each of said branches is connected to the midpoint of an inductive element, $L_p$ has a value of inductance three times the value of L and, said maximum Josephson current is twice as large as the currents in said remaining junctions.

* * * * *